United States Patent
Kuehn

(10) Patent No.: US 9,835,703 B2
(45) Date of Patent: Dec. 5, 2017

(54) METHOD AND APPARATUS TO DETERMINE A COMPLETE PARAMETER OF A MAGNETIC RESONANCE PULSE SEQUENCE

(71) Applicant: Bernd Kuehn, Uttenreuth (DE)

(72) Inventor: Bernd Kuehn, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 1291 days.

(21) Appl. No.: 13/848,985

(22) Filed: Mar. 22, 2013

(65) Prior Publication Data

US 2013/0249551 A1    Sep. 26, 2013

(30) Foreign Application Priority Data

Mar. 22, 2012  (DE) ......... 10 2012 204 625

(51) Int. Cl.
| | | |
|---|---|---|
| G01V 3/00 | (2006.01) | |
| G01R 33/44 | (2006.01) | |
| G01R 33/54 | (2006.01) | |
| G01R 33/28 | (2006.01) | |

(52) U.S. Cl.
CPC ........... G01R 33/44 (2013.01); G01R 33/543 (2013.01); G01R 33/546 (2013.01); *G01R 33/288* (2013.01)

(58) Field of Classification Search
CPC .................................................. G01R 33/546
USPC ........................................ 324/309, 307, 300
See application file for complete search history.

(56) References Cited

U.S. PATENT DOCUMENTS

| | | |
|---|---|---|
| 4,694,250 A | 9/1987 | Iwaoka et al. |
| 2004/0044279 A1 | 3/2004 | Lewin et al. |
| 2009/0039885 A1 | 2/2009 | Geppert et al. |
| 2010/0052678 A1* | 3/2010 | Heid ............... G01R 33/54 324/309 |
| 2011/0137598 A1 | 6/2011 | Kuehn |
| 2012/0041909 A1 | 2/2012 | Glaser-Seidnitzer et al. |
| 2013/0154643 A1* | 6/2013 | Kalechofsky ......... G01N 24/08 324/309 |
| 2015/0285885 A1* | 10/2015 | Feiweier ............ G01R 33/288 324/309 |
| 2016/0091585 A1* | 3/2016 | Benner .............. G01R 33/543 324/307 |

FOREIGN PATENT DOCUMENTS

| | | |
|---|---|---|
| JP | H02279140 A | 11/1990 |
| JP | 2010005064 A | 1/2010 |

OTHER PUBLICATIONS

Stöcker et al.; High-performance computing mri simulations; Magn. Reson. Med; vol. 64; pp. 186-193; (2010).

(Continued)

*Primary Examiner* — Louis Arana
(74) *Attorney, Agent, or Firm* — Schiff Hardin LLP

(57) ABSTRACT

In a method to determine a complete parameter of a pulse sequence composed of multiple pulse sequence modules for operating a magnetic resonance examination apparatus parameter information of the pulse sequence modules is stored in a memory in leaves and nodes of a tree structure, and the parameter information stored in the tree structure is evaluated to determine the complete parameter of the pulse sequence.

14 Claims, 5 Drawing Sheets

(56) References Cited

OTHER PUBLICATIONS

Gray et al. Genetic programming control of MR systems: optimisation of pulse sequence elements; Proc. Intl. Soc. Mag. Reson. Med; vol. 8; p. 1426; (2000).
Vahedipour et al. Juelich Extensible MRI Simulator, Abschnitt Sequence development tool JEMRIS_seq; Internetveröffentlichung (2011).
Magland, Sequence Tree4 User's Manual; (2008).

* cited by examiner

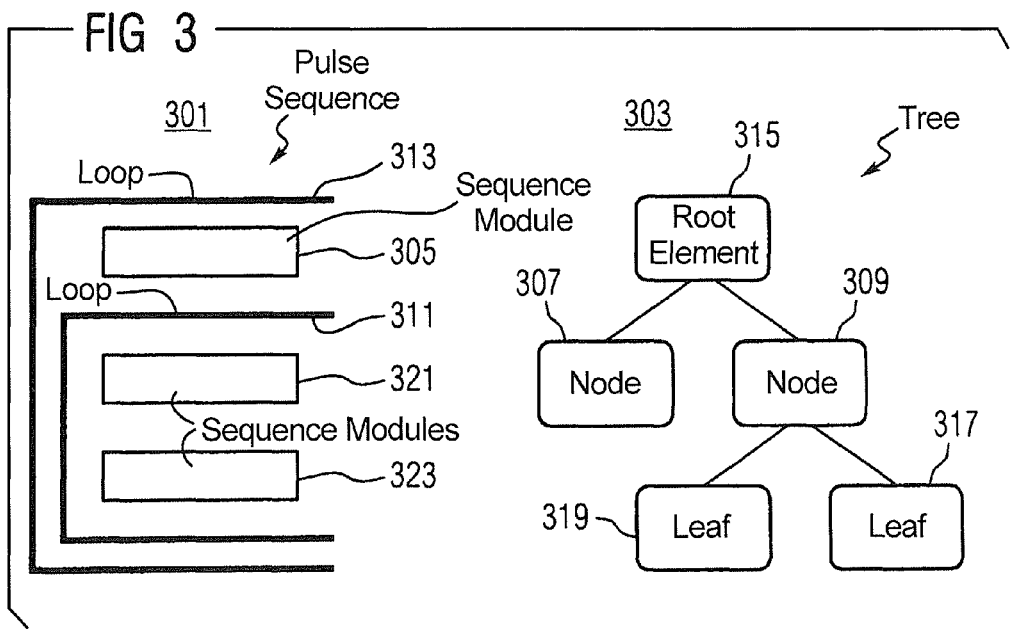
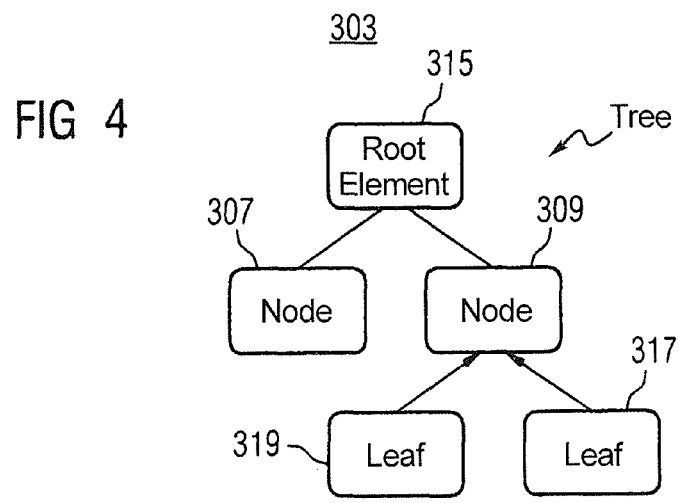

METHOD AND APPARATUS TO DETERMINE A COMPLETE PARAMETER OF A MAGNETIC RESONANCE PULSE SEQUENCE

BACKGROUND OF THE INVENTION

Field of the Invention

The present invention concerns: a method to determine a complete parameter of a pulse sequence with multiple pulse sequence modules for a magnetic resonance examination apparatus and a corresponding device; and a corresponding computer-readable data storage medium.

Description of the Prior Art

For medical examination of a patient in a magnetic resonance scanner (MR scanner), different pulse programs (MR pulse sequences) are used with which different properties of the tissue can be determined. In these pulse programs, an individual radio-frequency pulse (RF pulse) or a sequence of RF pulses is radiated into the tissue, which is located in a strong magnetic field. By the acquisition of the resulting magnetic resonance signal (also called MR signal or free induction decay, FID) and subsequent Fourier transformation thereof, images of the examined tissue can be acquired.

For example, an MR pulse can include one or more different sequence modules (for example kernel, saturator, EKG trigger) that are normally emitted (activated) periodically. In this case, the sequence modules are embedded in a structure composed of interleaved loops, of which each realizes a periodicity of the MR measurement, for example lines in k-space, averagings or phases.

The sequence modules that are used are characterized by (among other things) their frequency, duration and energy that are applied in their use. For example, in order to indicate the duration of an examination measurement to a user, the total duration of all applications with the different sequence modules of the sequence is calculated.

The total energy of the measurement can be calculated in a corresponding manner. The applied power and the specific absorption rate (SAR) can then be calculated from the two values. Using the specific absorption rate, for example, a decision can then be made as to whether a measurement can be implemented without endangering the patient. In addition to the total duration and total energy of a measurement, time intervals with consistent power represent an important variable for describing a measurement.

In the prior art, formulas are used in order to determine the aforementioned parameters (such as the total energy or the total duration) of the pulse sequence. It has proven to be disadvantageous that these formulas must be adapted for every change to the loop structure. Depending on an examination protocol setting—i.e. depending on whether an option is active or not—the loop structure of the pulse sequence changes, and the calculation formulas for energy and measurement duration that match this loop structure thereby change. It is consequently necessary to always adapt the calculation formulas when the pulse sequence changes in order to avoid incorrect calculations.

This leads to an increased implementation cost and a high tendency toward error, since typical MR sequences have excessively complex loop structures with a plurality of different pulses.

SUMMARY OF THE INVENTION

An object of the invention is to determine a (physical) complete parameter of a sequence by means of a generic method.

This object is achieved in accordance with the invention by a method to determine a complete parameter of a pulse sequence composed of multiple pulse sequence modules for a magnetic resonance examination apparatus, that includes storing parameter information of the pulse sequence modules in leaves and nodes of a tree structure; and an evaluation of the parameter information stored in the tree structure to determine the complete parameterization of the pulse sequence. An advantage achieved by the inventive method is that the complete parameterization can be determined for every arbitrary pulse sequence using a loop or tree structure that is simple to run through. In contrast to the conventional calculation on the basis of predetermined formulas, the calculation of the complete parameter after a change of the pulse sequence can be taken into account in a simple and generic manner in the calculation of the complete parameterization on the basis of the tree structure. This leads to a reduction of the implementation cost and the calculation steps required to implement the method, so the overall procedure can be implemented more energy-efficiently. In addition, the tendency toward error is reduced, and an examination that is safer overall results for the patient, since the limit values in the examination can be determined and complied with more precisely.

The method is computer-implemented and preferably runs completely automatically, meaning without any user interaction by a user. The method can be partially or entirely software-based. Moreover, it is possible to embed or integrate the method or system completely (or only the software solution) as an "embedded system" into the magnetic resonance examination apparatus and/or into a control computer in this regard (for example within the scope of a central server) so that it interacts with this. The method serves for storing, processing and relaying prepared data (in the form of control signals, parameters and/or instructions for pulse or measurement sequences) to other instances using computer-based technical devices (network). According to the invention, the control instructions for the magnetic resonance examination apparatus are addressed differently and thus are stored in modified form. The method therefore also takes into account the conditions of the data processing system in that the components and their control programs are addressed differently for the operation of the apparatus.

As noted above, the method is computer-implemented. Specific method segments can be fashioned as part of a microprocessor and thus are hard-wired, while other segments of the method are designed as software. In this case, only individual segments or parts of the method would be software-implemented. All segments of the method, or selected segments, are normally binary-encoded or present in digital form.

A magnetic resonance examination apparatus is an apparatus to examine and/or depict a sample (for example tissue and/or organs in the human or animal body) that utilizes the effect of magnetic resonance of nuclei in a magnetic field. For example, such apparatuses are designated as a magnetic resonance tomography apparatus or magnetic resonance scanner, and generate three-dimensional image data sets using the measurement data (MRI=Magnetic Resonance Imaging).

A pulse sequence is a series of individual pulses. An individual pulse is an electromagnetic pulse that acts on the nuclear spins in the magnetic field.

A pulse sequence module is either an individual pulse or a partial pulse sequence composed of multiple individual pulses.

A complete parameter is a physical parameter that characterizes the pulse sequence as a whole. For example, this complete parameter can be a total energy of the pulse sequence, a total duration of the pulse sequence, an average pulse duration, a specific absorption rate or any other technical/physical parameter that can be determined from the pulse sequence.

Parameter information of the pulse sequence module is information about a technical/physical property of a pulse module, for example duration, power, energy, frequency and/or amplitude.

A tree structure is formed by a contiguous graph that includes no cycles. The graph is maximally loop-free and minimally contiguous, such that no new edge is added to the edge set without generating a loop, and no existing edge can be removed without violating the contiguity property. The tree has a root element at the uppermost hierarchy level and ends with the leaves at the lowermost hierarchy level. Subordinate elements are designated as child elements while superordinate elements are designated as parent elements.

A tree structure—in particular a rooted tree, such as an out-tree—can be used as a data structure for pulse sequence data. Given limited organization, the rooted tree can be implemented so that every node includes a fixed set of variables or an array for the references to its children. The nodes also frequently possess a reference to their parent nodes, also called back-pointers. A tree of unlimited organization can be implemented in that dynamic lists are used instead of arrays.

Storing is a technical process of filing and writing data in a volatile or non-volatile memory, for example a RAM memory, a FLASH memory or a hard disk.

Evaluation is a technical process of processing information that is stored in the tree structure. For example, the tree structure can be traversed by means of different search algorithms in order to evaluate the information stored in the tree structure. The evaluation can take place via an electric circuit or a microprocessor. A memory to receive data can be provided to assist the microprocessor.

Definition is a technical process of a determination of an output value using one or more input values, for example via calculation using a formal relationship. The determination can take place via an electric circuit or a microprocessor.

In an advantageous embodiment, the method comprises the step of storing a repetition count of child elements in at least one node of the tree structure. For example, the technical advantage is achieved that the calculation steps to calculate the complete parameter are reduced since these can be calculated at least in part via multiplication.

A child element is an element of the tree structure that is situated one hierarchy level below its parent element.

In a further embodiment, the method includes the step of associating a repetition count of child elements with at least one edge of the tree structure. For example, the technical advantage is achieved that the pulse sequence can be mapped in the tree structure in a simple manner that is technically easy to evaluate.

An edge connects two nodes of the elements of the tree structure.

In a further embodiment, the method includes the step of evaluating the parameter information stored in a sub-tree to determine a partial parameter of the pulse sequence. For example, the advantage is achieved that the complete parameter can be determined via separate evaluation of individual regions of the tree structure and subsequent combination of the individual values. For example, a particularly suitable evaluation algorithm can be used for individual sub-regions of the tree structure so that the number of computer operations is reduced further.

In a further embodiment, the method includes the step of evaluating parameter information from child elements and storing parameter information obtained from the child elements in the parent elements of the child elements. For example, the advantage is achieved that a re-evaluation of a partial tree is omitted if the part of the pulse sequence that is associated with this partial tree has not changed. In particular, the number of computer operations that is required for the calculation of the complete parameter can be further reduced.

In another embodiment, the method includes the step of using a depth search or width search to traverse the tree, and an evaluation of the parameter information stored in the tree structure. For example, the advantage is achieved that the tree structure can be evaluated completely with particularly efficient algorithms and few computing operations.

The depth search is an uninformed search that searches deeper and deeper, bit by bit from the start node outwardly, by expansion of the respective first occurring follow-up node. The width search is an uninformed search that searches the width of the graph for an element, starting from the start node, via expansion of the individual hierarchy levels of the graph.

In a further embodiment, the method includes the step of generating a parameter series with a parameter information for each pulse sequence module using the tree structure. For example, the advantage is achieved that the chronological sequence of individual parameters during the pulse sequence can be simulated and evaluated.

In a further embodiment, the method includes the step of comparison parameter information for successive pulse sequence modules. For example, the advantage is achieved that computer operations can be simplified given the presence of identical or similar parameters in adjacent pulse sequence modules. For example, given the presence of an identical parameter in multiple successive pulse sequence modules, the evaluation can take place by multiplication instead of via addition, and thus can be implemented more quickly and with fewer computing steps.

In a further embodiment, the method includes the step of combining parameter information in the event that the parameter information of two successive blocks is the same. For example, the advantage is achieved that the number of computation steps required for evaluation can be even further reduced, and that the method can be implemented even more efficiently.

In a further embodiment, the parameter information includes power information or information about a specific absorption rate of a pulse sequence module, and the method includes the step of calculating a specific absorption rate for the entire pulse sequence. For example, the advantage is achieved that a complete parameter that is particularly suitable as a limit value can be determined in a technically simple manner in order to establish whether a measurement can be implemented.

In a further embodiment, the parameter information is information about a duration of a pulse sequence module, and the method includes the step of calculating the total duration of the pulse sequence. For example, the advantage is achieved that the duration of the examination can be determined particularly simply.

In a further embodiment, the parameter information is information about the energy of a pulse sequence module, and the method includes the step of calculating the total energy of the pulse series. For example, the advantage is achieved that the total energy of the pulse series can be determined in a particularly simple technical manner.

The above object also is achieved according to the invention by a magnetic resonance examination apparatus, wherein the magnetic resonance examination apparatus is designed to implement the method according to the invention as described above. The same advantages are achieved as with the method according to the invention.

The above object also is achieved in accordance with the present invention by a non-transitory, computer-readable data storage medium encoded with programming instructions that is loadable into a computerized control unit of a magnetic resonance imaging system. The programming instructions, when executed by the control unit, cause the magnetic resonance imaging system to implement any or all embodiments of the method described above.

BRIEF DESCRIPTION OF THE DRAWINGS

FIG. 3 shows a pulse sequence and its representation in a tree structure in accordance with the invention.

FIG. 4 schematically illustrates a calculation process in accordance with the invention.

DESCRIPTION OF THE PREFERRED EMBODIMENTS

Figure 1A:
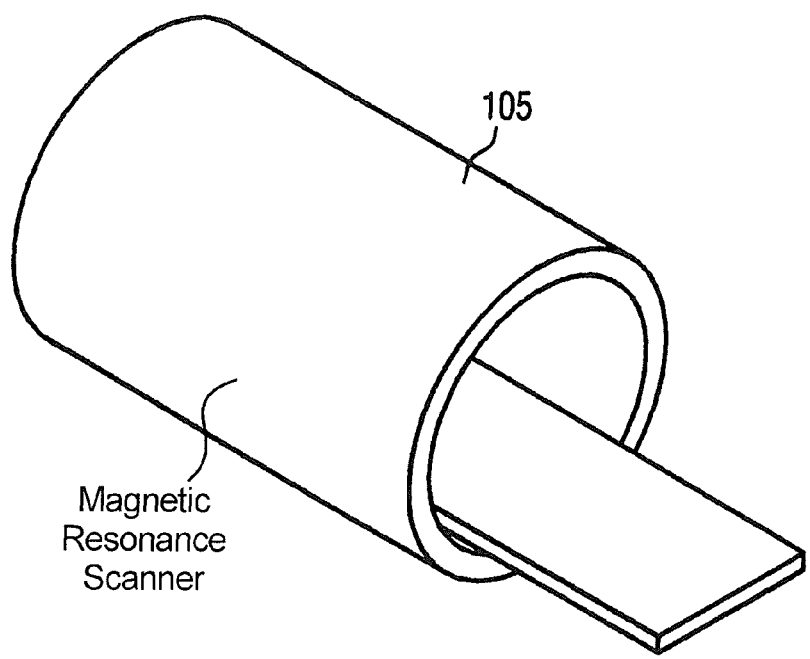
FIG. 1A schematically illustrates a magnetic resonance examination apparatus.

FIG. 1A schematically shows a magnetic resonance scanner 105 and an example of a pulse series 101. Different scan programs are executed in the examination of a patient at the magnetic resonance scanner (MR scanner) 105. For example, the scan programs control the coils arranged in the MR scanner in order to obtain different examination data and results, for example image data or data about a spin-spin relaxation or a spin-grid relaxation of a tissue.

For this purpose, inside the MR scanner 105 a radio-frequency (RF) field is generated that causes the individual nuclear spins of the sample to be excited by the electromagnetic pulses emitted by the coils. Depending on the type and sequence of these pulses, different properties of the sample can be detected. In the prior art, a number of pulse series are known for many different examination methods (for example SE, FISP, GRE). These pulse series often include a few hundred individual pulses. Depending on the examination method and examination options, however, the individual pulses of the pulse series that is used are not rigidly predetermined, but rather instead often vary with regard to any of power, duration, time interval between the pulses, and frequency.

The pulse sequence 101 normally is composed of one or more sequence modules, for example kernels, saturators, EKG triggers that are periodically used within the pulse series. The sequence modules that are used are characterized by—among other things—their duration and the energy that is applied upon their application.

In the examination, the sequence modules are embedded into a structure composed of interleaved loops, of which each realizes a periodicity of the MR measurement, for example lines in k-space, averagings or phases.

Figure 1B:
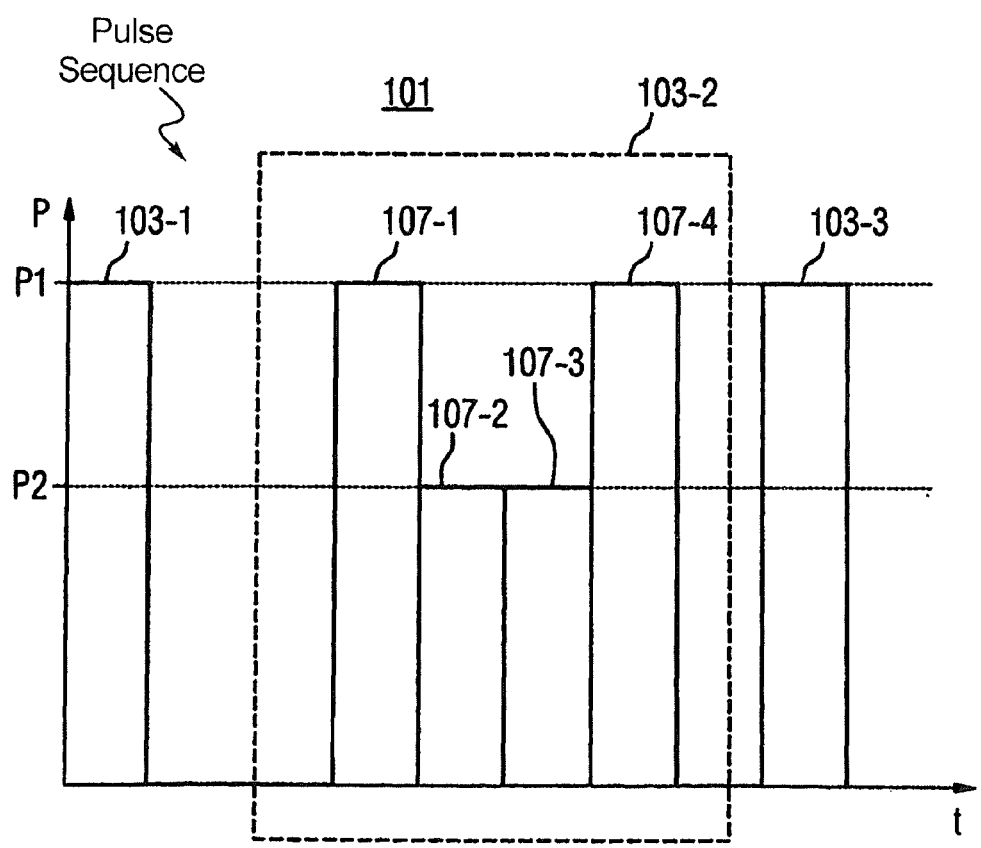
FIG. 1B schematically illustrates a pulse sequence for operating the magnetic resonance examination apparatus of FIG. 1A.

FIG. 1B shows as an example a time curve of a pulse series 101 that is composed of three sequence modules 103-1, 103-2 and 103-3. The sequence module 103-1 is composed of a rectangular individual pulse with the power P1; the sequence module 103-2 consists of four rectangular individual pulses 107-1 through 107-4 with different power P; and the sequence module 103-3 consists again of a rectangular individual pulse with the power P1.

The second sequence module 103-2 is composed of multiple individual pulses and includes the individual pulse 107-1 with the power P1, followed immediately by the two individual pulses 107-2 and 107-3 with the power P2. Directly following this is the individual pulse 107-4 with the power P1.

In general, each individual pulse of the pulse sequence has an individual duration, an individual power, an individual frequency and an individual shape.

In addition to the total duration and total energy of a measurement, time intervals with uniform power represent an important variable for description of the pulse series. These intervals enable a precise prediction of a specific absorption rate (SAR) as it is possible on the basis of the total measurement duration and total energy. For example, intervals with increased SAR can be compensated via intervals with lower SAR values.

However, in order to be able to display the duration of the examination to a user, the total duration of all sequence modules of the sequence is calculated. Moreover, the total energy of the measurement is calculated. The applied power and the specific absorption rate can then be calculated from these values in order to decide whether a measurement can be implemented without endangering the patient.

The circumstance that the individual pulse series and their loop structure change hinders the calculation of the aforementioned complete parameter for the pulse series; for example the total energy of all pulses of the pulse series; the duration of the pulse series; the average power of the pulse series; the specific absorption rate; and other parameters.

Figure 2:
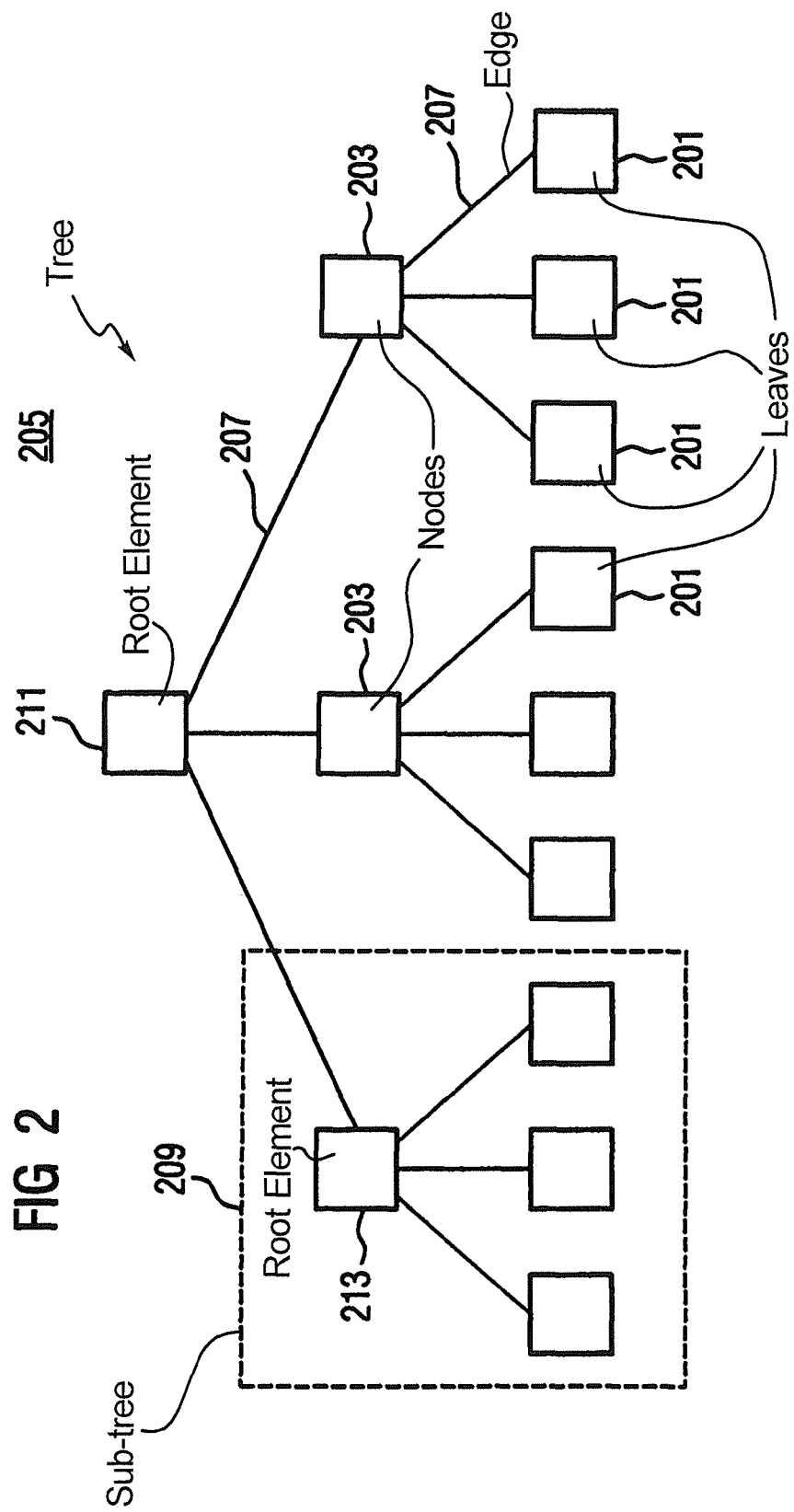
FIG. 2 illustrates a tree structure suitable for use in the method according to the invention.

FIG. 2 shows the structure of a tree 205 for structuring of data and information with three hierarchy levels. The tree 205 is a contiguous graph and includes a root element 211. Starting from the root element 211 at the uppermost hierarchy level, the tree 205 comprises additional elements that are designated as nodes 203 or leaves 201. The individual elements of the tree 205 are connected with one another via edges 207.

From the nodes 203, additional branches can emanate to elements known as child elements or leaves 201 at the lower hierarchy levels of the tree 203. These nodes 203 are then designated as a parent element with regard to the leaves 201 as child elements.

The leaves 201 represent the ends of the tree from which no additional branches emanate. The tree 205 includes a sub-tree 209 that in turn includes a root element 213.

In general, the number of nodes 203, the number of leaves 201 and the number of hierarchy levels is not limited to a specific number. An arbitrary number of leaves can emanate from each node.

In a tree-shaped data structure, specific information can be associated with each node, each leaf and each edge.

According to the present invention, the pulse sequence used in an examination is represented and stored using a tree structure. A loop structure of the pulse sequence can likewise be stored in the tree structure given repetitions of pulse sequence modules. The calculation of complete parameters that depending on individual pulse sequence modules is thereby markedly simplified. This is particularly advantageous when the individual pulse sequence modules of the pulse sequence are adapted depending on examination, and therefore no hard-set formulas can be used to calculate this complete parameter.

FIG. 3 shows a representation of a pulse sequence 301 in a tree 303.

For example, the nodes 307 and 309 represent sequence modules 305 or loops that enclose other loops or sequence modules.

For example, the "repetition" loop 313 is represented in a root element 315 of the tree 303. The repetition number of the subordinate pulse elements can be stored in the root element 315.

The root element 315 has the nodes 307 and 309. The node 307 comprises the parameter information for the pulse sequence module 305 ("TokTokTok"), and the node 309 comprises the information about a repetition count of subordinate leaves in the loop 311 ("Lines").

The node 309 has the leaves 317 and 319 that are simultaneously leaves of the tree 303. The leaf 317 includes the parameter information for the pulse sequence module 323 ("Kernel"), while the leaf 319 comprises the parameter information the for pulse sequence module 321 ("FatSat").

In this way, pulse sequence modules of arbitrary pulse sequences can be associated in a simple manner with individual elements of a tree structure. One or more parameters that reflect a property of the pulse sequence module (for example length, energy, power or SAR value) can then be stored in each of the elements of the tree structure. The repetition count of subordinate elements—i.e. of pulse sequence modules to be repeated—can be stored in the respective node. In an alternative embodiment, this information can also be associated with the individual nodes of the tree, such that a weighted graph is created.

The technically particularly simple and efficient method for calculation of the total measurement duration and the total energy, or other technical parameters, are based on the foundation of this tree structure as a representation of the pulse sequence and its loop structure.

In a first embodiment of the method, the calculation begins at the lowermost hierarchy or branch level of the tree structure on which the leaves are arranged. The leaves represent individual pulse sequence modules of the pulse sequence and include information about the duration and energy of the respective pulse sequence modules.

The respective values are transferred to the parent element and merged into this. For example, this occurs by adding the two values and storing the result in the parent element. In an alternative embodiment, a mean time value can also be calculated from the two values. However, in general other calculation methods are also conceivable.

According to this process, for example, the parent element comprises information about that portion of the pulse sequence that corresponds to the sub-tree or partial tree that emanates from the parent element.

FIG. 4 shows this process using the tree 303 shown in FIG. 3.

The parent element is the loop 309 ("Lines"). The parameter values of the leaves 317 and 319 are added and multiplied with the loop length. In this way, duration and energy are associated with the nodes 309 "Lines".

Figure 5:
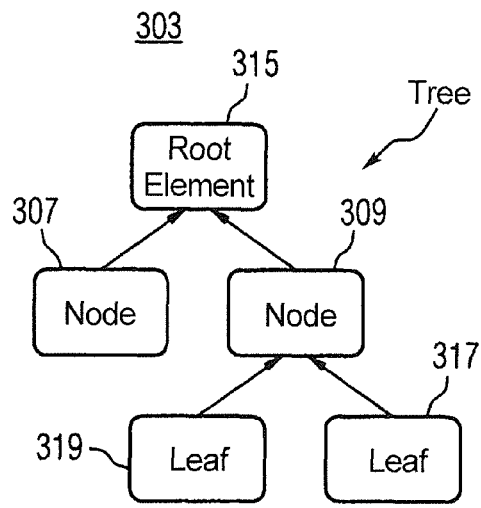
FIG. 5 is an additional schematic illustration of a calculation process in accordance with the invention.

FIG. 5 shows the next step in the calculation of the complete parameter.

In this step of the calculation, the elements of the second lowermost branch level—in this case the nodes 307 and 309 ("TokTokTok" and "Lines")—deliver the information included in them about duration and energy to the root element 315, which here is simultaneously the root element 315. The information about the duration and energy of the corresponding pulse sequence module is stored in advance in the node 307 ("TokTokTok").

For the node 309 ("Lines"), the duration and energy have been determined in the calculation step described above with regard to FIG. 4. These values of the two nodes 307 and 309 are passed to the next, higher branch plane and merged into the root element 315 by means of a calculation.

A complete parameter for the pulse sequence this can be determined in a particularly simple, technical manner and with few calculation steps even when individual pulse sequence modules have changed. This is in particularly advantageous for time-critical situations.

In general, for arbitrary pulse sequence trees these steps are repeated until the uppermost branch level is reached, and thus the duration and energy of the entire tree has been determined. By implementation of this method, the measurement duration and energy of every arbitrary pulse sequence stored in the tree structure can be calculated with this.

In a second embodiment of the method to determine the measurement duration or energy of the pulse sequence, the tree structure is "rolled out". In this case, all loops are executed or simulated so that the information about the measurement duration or energy that is stored in the leaves is polled and added up in each loop pass.

The advantage of this method lies in its generality, in particular given dependencies between different elements of the tree structure. This method is particularly advantageous due to its simplicity when dependencies exist between different elements of the tree. For example, if the duration or the energy of a pulse sequence module is a function of a loop counter, the rolling out of this loop is a simple method to calculate the total duration or energy of the respective pulse sequence module.

The mean applied power of a measurement can then be calculated from the method described above.

In a third embodiment of the method, a time curve of a parameter value (s SAR value, for example) can be determined. In this embodiment, the tree is initially rolled out, and at every retrieval of a leaf its stored information about the duration or energy of the corresponding pulse sequence module is polled.

If the power calculated from the values of a leaf—possibly under consideration of a tolerance—coincides with the power of the preceding element, the values for duration and energy of the respective elements are added up, and both elements are merged into a single block with homogenous power.

If the power of the next element or leaf likewise coincides with the power of the block, it is also added to this block.

These steps are repeated until an element is retrieved whose stored power has a greater deviation from the power of the block. This element now forms a new block with a different power that is extended by new elements until an element is found whose power in turn deviates too significantly from the power of the current block.

These steps are repeated until the tree structure is completely rolled out and a complete set of blocks (and values associated with these) have been determined for the pulse sequence. Each of these blocks then represents an interval in which the applied power of the pulse sequence is temporally homogenous within the tolerance value. The determination of time intervals with homogenous power is markedly simplified via this method.

Figure 6:
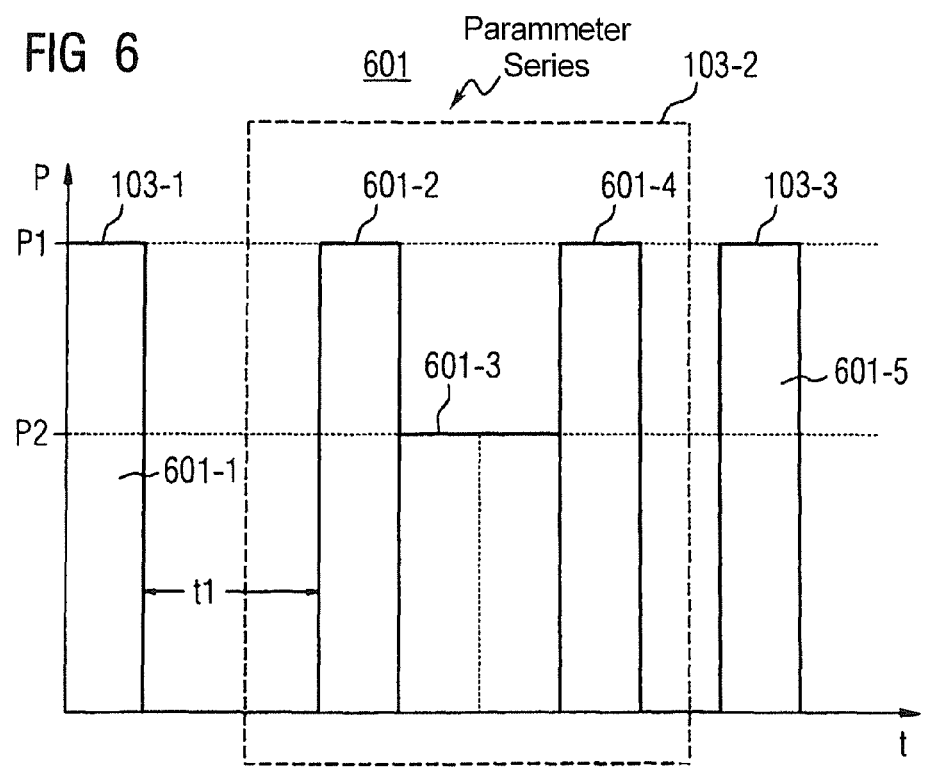
FIG. 6 shows a parameter sequence with multiple blocks in accordance with the invention.

FIG. 6 shows a parameter series 601 that arises from the pulse sequence 101 shown in FIG. 1, which parameter series 601 is obtained by rolling out the tree structure. The parameter series represents the time curve of a parameter.

According to the method described above, blocks with identical values are hereby formed. The individual pulse 103-1 with power P1 forms a first block 601-1. In the time interval Ti, the pulse 107-1 forms a second block 602-2. The subsequent pulses 107-2 and 107-3 form a common third block 601-3 due to the identical power value P2. The parameter blocks 601-4 and 601-5 subsequently follow.

In general, other parameters can likewise be used within the method, for example a frequency of the pulses.

In general, it is possible to respectively use that embodiment of the method described above that is most suitable for evaluation of the underlying pulse modules. In addition to this, it is moreover possible to apply multiple different methods in a tree so that the method according to the first embodiment is used for a first partial tree and the method according to the second embodiment is used for a second partial tree, for example. For the method according to the third embodiment it also applies that this can be applied independently of the respective loop structure. The different embodiments of the method can therefore be used for the calculation of the measurement duration and energy of arbitrary sub-trees.

Figure 7:
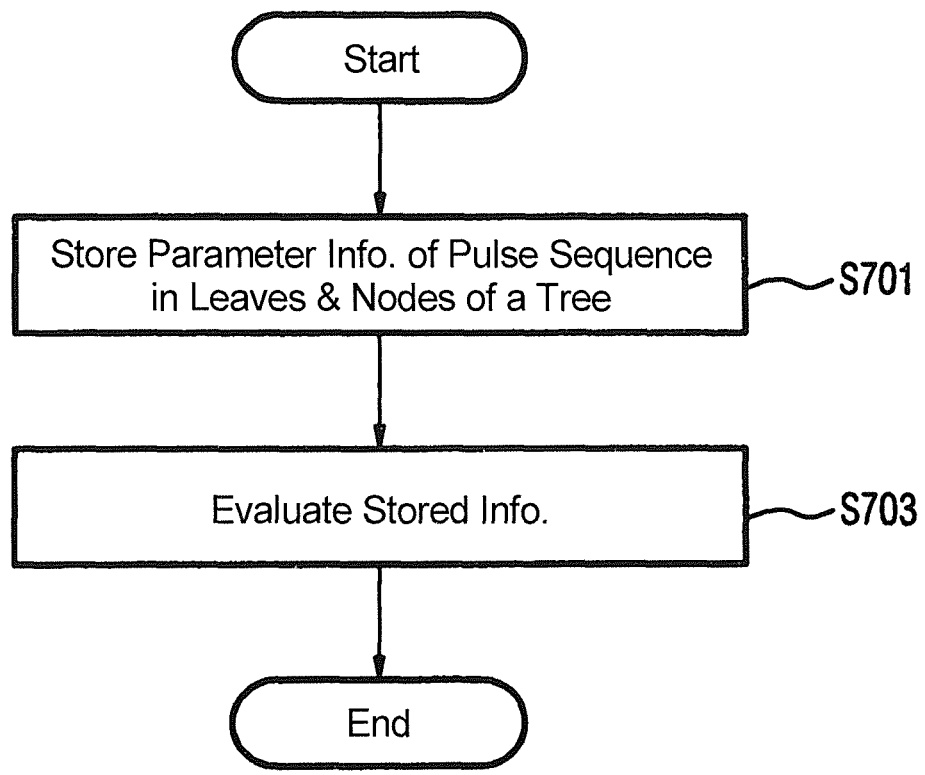
FIG. 7 is a block diagram of an embodiment the method according to the invention.

FIG. 7 shows a block diagram of the method according to the invention to determine a complete parameter of a pulse sequence 101 with multiple pulse sequence modules 103. In the first Step S701, the parameter information of the pulse sequence modules 103 is stored in leaves 201 and nodes 303 of a tree structure 205. In the second Step S703, the parameter information stored in tree structure 205 is then evaluated to determine the complete parameter SAR of the pulse sequence 101.

The present invention uses the representation of a pulse sequence and its loop structure in the form of a tree structure to calculate the measurement duration and energy. In general, the method described above can be used for any arbitrary loop or, respectively, tree structure. In contrast to the calculation on the basis of a predetermined formula, given calculation on the basis of the tree structure the calculation of the measurement duration and energy can be adapted simply after a change of the loop structure or a pulse sequence module. This reduces the implementation cost and decreases the tendency of the examination towards error.

The aforementioned embodiments are described in an example for the determination of a measurement duration and total energy of the pulse sequence and do not limit the scope of the invention. In general, these methods can also be used for the determination of additional parameters, for example the loading of a system component as a result of the measurement and to maintain load cycles (duty cycles).

As will be apparent to those skilled in the art, the invention can be realized partially or completely in software and/or hardware and/or can be distributed across multiple physical products (in particular also computer program products).

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to determine a complete parameter of a pulse sequence comprised of multiple sequence modules, for operating a magnetic resonance apparatus, comprising:
   electronically storing multiple pulse sequences, each as a tree structure comprising a plurality of nodes, in which parameter information of the respective pulse sequence modules of the respective pulse sequence is individually stored, with each node being connected in the tree structure by respective edges to multiple leaves, with a detail of the parameter information of the respective node being stored in each leaf connected thereto;
   making an entry into a processor that selects a pulse sequence from said memory, as selected pulse sequence for operating the magnetic resonance apparatus and, from the processor, accessing and retrieving the tree structure for the selected pulse sequence;
   in said processor, executing a tree structure evaluation algorithm for the retrieved tree structure for the selected pulse sequence, in order to determine a complete parameter of the selected pulse sequence as a combination of the parameter information stored in the nodes and leaves of that tree structure; and
   in the processor, generating an electrical signal representing the complete parameter of the selected pulse sequence, and making the electronic signal available from the processor as an output.

2. A method as claimed in claim 1 comprising storing a repetition count of leaves in at least one node of said tree structure.

3. A method as claimed in claim 1 comprising associating a repetition count of leaves with at least one edge of said tree structure.

4. A method as claimed in claim 1 comprising evaluating the parameter information stored in respective portions of said tree structure, each portion comprising at least one node, in order to determine a partial parameter of said pulse sequence from each portion, and combining all partial parameters from all portions of said tree structure to determine said complete parameter.

5. A method as claimed in claim 1 comprising evaluating parameter information details from leaves of said tree structure, and compiling and storing the parameter information details from said leaves as the parameter information of the respective node connected to those leaves in said tree structure.

6. A method as claimed in claim 1 comprising, in said tree structure evaluation algorithm, implementing a depth search or a width search to traverse said tree structure and evaluate said parameter information stored in said tree structure.

7. A method as claimed in claim 1 comprising evaluating said tree structure to generate a parameter sequence with parameter information for each of said pulse sequence modules.

8. A method as claimed in claim 7 comprising comparing respective parameter information of successive pulse sequence modules.

9. A method as claimed in claim 8 comprising merging parameter information of said successive pulse sequence modules if the parameter information of two successive pulse sequence modules is the same.

10. A method as claimed in claim 7 comprising generating, as said parameter information, power information, or information describing a specific absorption rate of a pulse sequence module, and comprising calculating a specific absorption rate for the pulse sequence from said parameter information.

11. A method as claimed in claim 1 wherein said parameter information describes a duration of a pulse sequence module, and comprising calculating a total duration of said pulse sequence from said parameter information.

12. A method as claimed in claim 1 wherein said parameter information is information describing an energy of a pulse sequence module, and comprising calculating a total energy of said pulse sequence from said parameter information.

13. A magnetic resonance apparatus comprising:
a magnetic resonance data acquisition unit configured to operate according to a pulse sequence comprised of multiple sequence modules;
a memory in which multiple pulse sequences are stored, each as a tree structure comprising a plurality of nodes, in which parameter information of the respective pulse sequence modules of the respective pulse sequence is individually stored, with each node being connected in the tree structure by respective edges to multiple leaves, with a detail of the parameter information of the respective node being stored in each leaf connected thereto;
a processor having an input interface configured to receive an entry into the processor that selects a pulse sequence from said memory, as a selected pulse sequence for operating the magnetic resonance apparatus, and said the processor being configured to then access and retrieve the tree structure for the selected pulse sequence;
said processor being configured to execute a tree structure evaluation algorithm for the retrieved tree structure for the selected pulse sequence, in order to determine a complete parameter of the selected pulse sequence as a combination of the parameter information stored in the nodes and leaves of that tree structure; and
said processor being configured to generate an electrical signal representing the complete parameter of the selected pulse sequence, and to make the electronic signal available from the processor as an output.

14. A non-transitory, computer-readable data storage medium encoded with programming instructions, said storage medium being loaded into a processor of a magnetic resonance apparatus, that comprises a magnetic resonance data acquisition scanner operable according to a pulse sequence that comprises a plurality of sequence modules, and a memory in which multiple pulse sequences are stored, each as a tree structure comprising a plurality of nodes, in which parameter information of the respective pulse sequence modules of the respective pulse sequence is individually stored, with each node being connected in the tree structure by respective edges to multiple leaves, with a detail of the parameter information of the respective node being stored in each leaf connected thereto, said programming instructions causing said processor to:
receive an entry into a processor that selects a pulse sequence from said memory as a selected pulse sequence for operating the magnetic resonance apparatus and to then access and retrieve the tree structure for the selected pulse sequence;
execute a tree structure evaluation algorithm for the retrieved tree structure for the selected pulse sequence, in order to determine a complete parameter of the selected pulse sequence as a combination of the parameter information stored in the nodes and leaves of that tree structure; and
generate an electrical signal representing the complete parameter of the selected pulse sequence, and make the electronic signal available from the processor as an output.

* * * * *